(12) United States Patent
Gerlach

(10) Patent No.: US 8,611,382 B2
(45) Date of Patent: Dec. 17, 2013

(54) OUTPUT POWER STABILIZATION FOR LASER DIODES USING THE PHOTON-COOLING DEPENDENT LASER VOLTAGE

(75) Inventor: Philipp Henning Gerlach, Blaustein (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/203,051

(22) PCT Filed: Feb. 23, 2010

(86) PCT No.: PCT/IB2010/050777
§ 371 (c)(1),
(2), (4) Date: Aug. 24, 2011

(87) PCT Pub. No.: WO2010/097751
PCT Pub. Date: Sep. 2, 2010

(65) Prior Publication Data
US 2012/0014400 A1    Jan. 19, 2012

(30) Foreign Application Priority Data
Feb. 25, 2009    (EP) .................................. 09153584

(51) Int. Cl.
*H01S 3/13*    (2006.01)

(52) U.S. Cl.
USPC .............. 372/29.021; 372/29.011; 372/29.02; 372/50.12

(58) Field of Classification Search
USPC ................. 372/29.011, 29.02, 29.021, 50.12
See application file for complete search history.

(56) References Cited

U.S. PATENT DOCUMENTS

| | | | |
|---|---|---|---|
| 4,622,672 A | 11/1986 | Coldren et al. | |
| 5,953,359 A * | 9/1999 | Yamaguchi et al. | 372/50.12 |
| 2003/0072336 A1 | 4/2003 | Senapati et al. | |
| 2004/0075399 A1 * | 4/2004 | Hall | 315/291 |
| 2004/0202210 A1 | 10/2004 | Thornton | |
| 2006/0093000 A1 * | 5/2006 | Nam et al. | 372/43.01 |
| 2006/0193356 A1 | 8/2006 | Osiander et al. | |
| 2009/0097522 A1 * | 4/2009 | Justice et al. | 372/50.11 |

FOREIGN PATENT DOCUMENTS

| | | |
|---|---|---|
| EP | 1085624 A1 | 3/2001 |
| EP | 1972924 A1 | 9/2008 |
| JP | 2004158505 A | 6/2004 |
| WO | 9802719 A1 | 1/1998 |
| WO | 2008108475 A1 | 9/2008 |

OTHER PUBLICATIONS

Jiang et al., "Vertical Cavity Surface Emitting Laser Packaging with Auto Power Control", IEEE Electronic Components and Technology Conference, 1997, pp. 368-370.

* cited by examiner

*Primary Examiner* — Yuanda Zhang
(74) *Attorney, Agent, or Firm* — David Zivan; Mark Beloborodov

(57) ABSTRACT

It is an object of the invention to simplify the power stabilization of laser diodes. For this purpose, a laser device comprising a die and thereon a first laser diode and a second laser diode is provided. The second laser diode has a structure or element that avoids lasing if a supply voltage is applied that is sufficient for the first semiconductor laser cavity to emit laser light.

19 Claims, 3 Drawing Sheets

OUTPUT POWER STABILIZATION FOR LASER DIODES USING THE PHOTON-COOLING DEPENDENT LASER VOLTAGE

FIELD OF THE INVENTION

The invention relates to semiconductor lasers in general. More specifically, the invention concerns the stabilization of the laser output power or laser intensity, respectively.

BACKGROUND OF THE INVENTION

Usually, the output power of VCSELs is strongly dependent on temperature and ageing condition. In order to avoid output power variations, some applications require sophisticated control or feedback mechanism like the usage of monitor photodiodes, for example.

Since the laser voltage depends on a lot of parameters and not only on the output power, the laser voltage usually is not a good indicator for output power.

It is known from Liu et al., Journal of Zhejiang University SCIENCE A, ISSN 1009-3095 that the laser voltage of VCSELs can empirically be described as $$V=(I*R_0)/(T-T1)+V_t*\ln(1+(I/(I0*(T-T_1)))) \quad \text{(equation 1),}$$

where I denotes the laser current, V the laser voltage and T the internal laser temperature i.e the temperature inside of the cavity. $R_0, T_1, V_t$ and $I_0$ are VCSEL characteristic parameters. In particular, these parameters are depending on production parameters such as the doping profile, active diameter, etc, and can be controlled only with low lot-to-lot precision.

The correlation between the internal laser temperature and the temperature

Ths of the heat sink is given by $$T=Ths+(V*I-P_{opt})*R_t \quad \text{(equation 2).}$$

In this equation, $P_{opt}$ denotes the laser output power and $R_t$ the thermal resistance.

The term $$-P_{opt}*R_t$$

is known as photon-cooling effect, because the power of the emitted photons will not contribute to the heating of the laser. The power-dependency of the laser voltage V is then derived by combining equations 1 and 2.

Usually, the laser voltage cannot be used as a reliable indication for the output power of the VCSEL because the parameter $R_0, T_1, V_t$ and $I_0$ are generally not known.

For this reason, often monitor photodiodes are employed to monitor and stabilize the laser output power. However, the efficiency of monitor photodiodes is slightly temperature dependent and may deteriorate upon operation. Thus, the measured input parameter is dependent on the laser power, aging and ambient conditions and can distort the characteristics of the stabilization circuitry. To avoid this, stabilization circuitry often employs additional temperature measurement means thus complicating the design. A stabilization circuitry of this type is known for example from EP 1 085 624 A1.

SUMMARY OF THE INVENTION

It is therefore an object of the invention to simplify the stabilization of the output power of laser diodes and to lessen the susceptibility of the control circuitry from changes in temperature and other power dependent and ambient conditions.

It is suggested to use two laser diodes such as two almost identical VCSEL mesas within one die. The first laser diode or mesa is used as the light source. Its voltage characteristic depends on the four material parameters mentioned above and on the output power. The second laser diode has an additional structure that avoids lasing, resulting in a voltage characteristic that depends on the same four material parameters only. Then, the difference in the voltage characteristics of the lasing diode and the non-lasing laser diode is only due to photon-cooling. As the photon cooling is directly proportional to the laser power, or laser intensity, respectively, the differences between the measured actual operating parameters of the diodes can be used for a simple power stabilization.

For this purpose, a laser device comprising a die and thereon a first laser diode and a second laser diode is provided. The second laser diode is arranged laterally offset with respect to the optical axis of the first laser diode. Each of the first and second laser diodes have at least one electrical connection terminal for applying a supply voltage, so that different voltages can be applied to the first and second laser diodes. The first laser diode is a common laser diode being capable of emitting laser light upon appliance of a sufficient voltage. The second laser diode, however, has a structure or element that avoids lasing if a supply voltage is applied that is sufficient for the first semiconductor laser diode to emit laser light. Of course, both laser diodes are operated with the correct polarity.

This arrangement allows for a simple stabilization of the laser power by controlling the laser voltage using appropriate circuitry.

To control and stabilize the laser output power, use is made of a comparison of the characteristics of both lasers. Thereby, lot dependent deviations in the material dependent parameters are largely eliminated since both lasers are produced simultaneously on a common chip and therefore the material dependent parameters of both laser diodes are at least substantially equal or even identical. Even if different laser diodes are used, however, it is advantageous to produce them in parallel so that both laser diodes have the same subsequence of layers.

Since photon-cooling is proportional to the output power of VCSELs, this invention proposes to use the voltage characteristics of two identical or almost identical densely packed laser diodes such as VCSELs, where one diode is altered to avoid lasing as an input for output power stabilization of the other laser diode. Thus, according to a preferred refinement of the invention, the laser voltage to be used as input parameter of a control circuitry for stabilizing the laser power.

More specifically, the control circuitry connected to the first and the second laser diode may be arranged to stabilize the laser output power on the basis of the difference of the voltages across the first and second laser diode.

This may be very simply achieved by control circuitry comprising a feedback loop with a differential amplifier such as an operational amplifier. Thereby, voltage drops along two current paths are tapped and fed in to the differential amplifier, whereby in each of the current paths one of the laser diodes is connected and whereby a voltage divider divides a predetermined ratio of the voltage drop along one of the paths. The divided voltage is fed into one input of the differential amplifier and the voltage tapped from the other path is fed in to the other input thereof. In particular the predetermined ratio may be tunable, e.g. by means of a potentiometer.

In a preferred embodiment of the invention, the first and second laser diodes are vertical surface emitting laser diode (VCSEL) mesa structures arranged laterally offset onto a die.

However, it is also possible to use edge-emitting lasers for the invention.

The first and second laser diodes then may share a common terminal on the backside of the die, i.e. the side of the die opposite to the front side where the mesas are arranged and have separated terminal contacts on the front side. Further, the mesas may advantageously share a common lower Bragg reflector stack. This not only simplifies the production process but also increases the thermal coupling between the diodes.

As well, it is advantageous for this purpose to arrange the laser diodes as close as possible to each other. Thus, according to a further refinement of the invention, the lateral distance between the centers of the laser diodes is less than 500 micrometer, preferably less than 250 micrometers.

If the voltage difference between both lasers is assumed or approximated as being a linear function of the output power of the first laser diode, a very simple control circuitry may be employed. The control circuitry further may advantageously comprise setting means for setting an output power by setting the difference of the operating voltages of said first and second laser diodes. Such a setting means may be simply implemented by a potentiometer.

The structure that avoids lasing may be a structure or element that reduces the resonator quality of the second laser diode. The structure may thereby act by disturbing or altering the phase front of the light reflected back at one of the reflector elements of the second laser diode, where the structure is located, e.g., by introducing random phases to the reflected light. Another possibility is to change the vertical position of the interface to the air. In the case of VCSELs as first second laser diodes, this structure that avoids lasing may be a surface etch on top the second laser diode. This is advantageous as a surface etch effectively suppresses lasing without the need of complicated further fabrication steps. Alternatively, the interface of the upper distributed Bragg-reflector to air may be lowered by about a quarter wavelength with respect to the first laser diode. This considerably reduces the overall reflectivity of this Bragg-reflector layer stack as a destructive interference is introduced at the interface. Of course, to introduce a destructive interference, this lowering does not need to be a quarter wavelength exactly. A destructive interference may also be introduced in other ways. For example, an additional layer may be deposited. The surface etch may also simply roughen the surface. Alternatively, a specific structuring may be introduced into the upper Bragg reflector stack by an appropriate masking. However, it may also be possible to introduce other structures for the purpose of avoiding lasing of the second laser diode. For example, the planarity of the layers of at least one of the Bragg reflector layer stacks may be disturbed. One example is to introduce a small depression into one of the lower layers of a distributed Bragg reflector. Then, the subsequently deposited layers are bent and distorted in the vicinity of the depression. The non-planarity of the DBR introduced this way reduces the optical resonator quality. On the other hand, if the depression is small, the material characteristics as given in above equations 1 and 2 remain nearly unaffected.

Generally, the invention may be used to compensate for temperature drifts but may also serve as a reliable end-of-life detector. Further, laser devices according to the invention are useful for applications in the field of optical transmitters. As well, as explained below, a laser device according to the invention can be used as a gauging light source since a measurement of the differences of the laser voltages allows for an accurate determination of the light intensity.

DETAILED DESCRIPTION OF EMBODIMENTS

Figure 1:
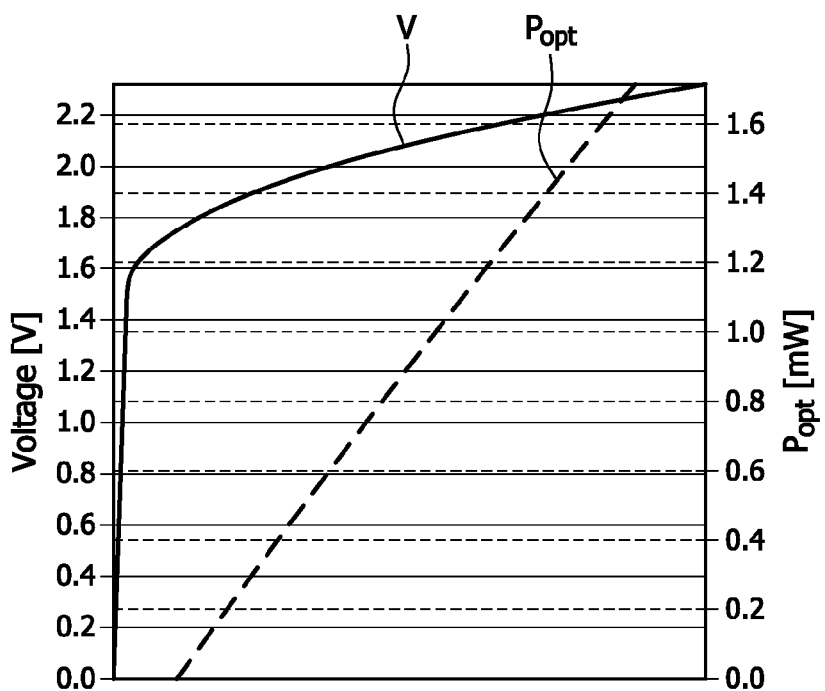
FIG. 1 shows the output and voltage characteristic of a state-of-the-art single mode VCSEL with 850 nm wavelength.

In FIG. 1 typical characteristics of a VCSEL are shown. Specifically, FIG. 1 shows the characteristic of the laser power and the voltage as a function of the laser current. As can be seen from FIG. 1, the laser output power $P_{opt}$ varies nearly linearly with the laser current whereas the laser voltage is strongly non-linear. Thus, the laser voltage usually is no good control variable to stabilize the laser output power. However, according to the invention the difference of the laser voltage of a lasing diode and a non-lasing diode of similar design does provide a very good control variable which furthermore allows for a simple control circuitry.

Therefore, a laser device is contemplated, wherein a first laser diode and a second laser diode are placed close to each other onto the same die. One of the diodes is a normal laser, the other one has an additional structure that avoids lasing if a supply voltage is applied that is sufficient for the first semiconductor laser cavity to emit laser light.

Figure 2:
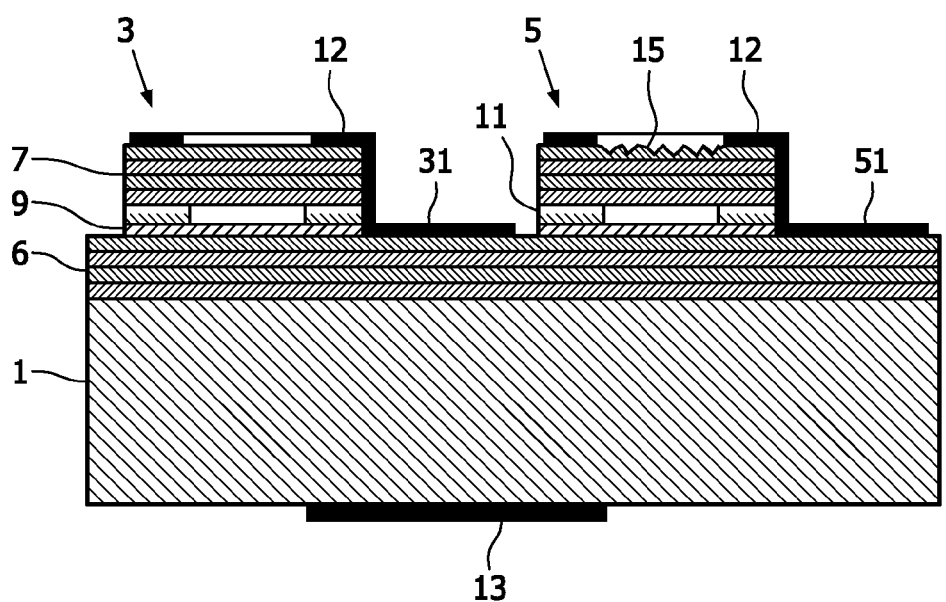
FIG. 2 shows a schematic cross section through a laser device according to the invention.
Figure 3:
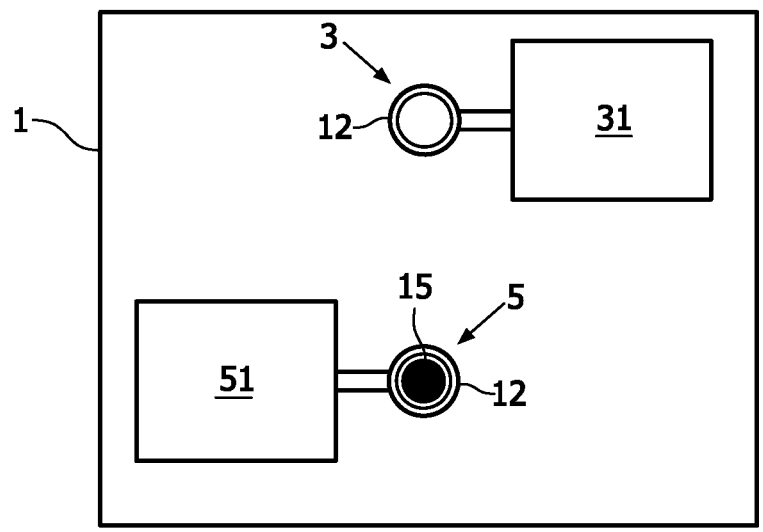
FIG. 3 shows a top view onto the laser device.

A cross section of a laser device according to the invention is shown in FIG. 2. A top view of the device is shown in FIG. 3.

The device as shown is set up as a VCSEL. The device comprises a die or chip 1 as a substrate for two VCSEL laser diodes 3, 5. As can be seen from FIG. 2, both laser diodes 3, 5 share a common lower Bragg reflector layer stack 6. On this lower Bragg reflector layer stack 6, the layers of the mesa structures are deposited. The mesa structures each of the laser diodes 3, 5 comprise one or more quantum wells 9 as active regions, one or more current confinement layers 11 and an upper Bragg reflector layer stack 7.

The one or more quantum wells 9 are arranged between the lower and upper Bragg reflector layer stacks 6 and 7, respectively.

The current confinement layer 11 is a semiconducting layer which is partially oxidized at its edge so that the conductivity is higher in the center of this layer. Thereby, the current is confined to the center of the mesa near its optical axis. This layer is not mandatory but useful for generation of a highly defined beam.

The layers of the mesas together with the lower Bragg reflector layer stack form a diode, wherein one of the Bragg reflector layer stacks is n-doped or n-type conducting and the other stack p-doped or p-type conducting.

Often, n-type lower Bragg-reflector layer stack 6 and p-type upper Bragg-reflector stack 7 are used.

Common materials for the VCSELs are GaAs substrates for the dies and alternating GaAs/AlGaAs layers for the distributed Bragg reflectors or Bragg-reflector layer stacks. As quantum well, a thin InGaAs-layer is suitable. For example, the quantum well layer 9 may be composed by an InGaAs layer embedded between two GaAs quantum well barrier layers. Inter alia, following combinations of materials are common for VCSELs: An emission wavelength of about 760 nm may be achieved using AlGaAs for both the quantum well layer and the quantum well barrier layers. Using GaAs for the quantum well layer and AlGaAs for the quantum well barrier layers is suitable for wavelengths in a range around 850 nm. Wavelengths around 980 nm may be achieved by the above mentioned combination of an InGaAs quantum well layer and GaAs quantum well barrier layers. For long wavelengths of around 1300 nm, for example, InGaAsN as quantum well layer in combination with InGaAs as quantum well barrier layers may be employed.

However, there are further combinations of materials known to a person skilled in the art. For example, it is also possible to use InP or GaInAsN at least for the active region.

On top of each of the mesas of the laser diodes 3, 5, a ring contact 12 is deposited. The ring contacts 12 of the laser diodes 3, 5 are connected to separate terminal contacts 31, 51 of the laser diodes 3, 5, respectively. In a typical arrangement of layers, these terminal contacts 31, 51 are the anode contacts of the diodes. Further, both laser diodes 3, 5 share a common second terminal contact 13 at the backside of the die 1. Typically, this contact is the cathode contact for the laser diodes 3, 5.

As can be seen from FIGS. 2 and 3, a surface etch 15 has been applied to the upper Bragg-reflector layer stack 7 of laser diode 5. The surface etch has been introduced to the exposed are in the center of ring contact 12.

Due to the etching of the Bragg-reflector layer stack 7, the surface of the stack has been roughened. Thereby, the phase front of light reflected back at this surface is disturbed which in turn reduces the resonator quality of the second laser diode 5. A result of this lowered resonator quality is that lasing of laser diode 5 is avoided whereas laser diode 3 emits laser light even if both laser diodes 3, 5 are operated with the same current. This condition can be maintained at least up to a certain threshold current, where the second laser diode 5 also reaches lasing condition. However, it may also be possible to avoid lasing of the second laser diode 5 at all. Even if the surface remains plain by the etch, the etch 15 is preferably carried out so as to reduce the height of the upper Bragg-reflector layer stack 7. Thereby, a destructive interference is introduced at the interface of the layer stack to the ambient air which reduces the overall reflectivity of the Bragg-reflector layer stack 7 and is very effective in avoiding a lasing condition of laser diode 5. Alternatively, an additional layer may also be applied having a similar effect. For example, one or more anti-reflection layers may be deposited on top of Bragg-reflector layer stack 7.

The ring contact 12 may simultaneously be used as a mask for the etching so that the surface etch 15 is confined to the opening of the ring contact 12. As nearly no current flows at the etched surface, the etching has no or only minor influence to the material dependent parameters as given above in equations 1 and 2.

It is advantageous for the stabilization of the laser output power of laser diode 3 if the difference between the temperature within the cavities of the laser diodes is as small as possible. Thus, a good thermal coupling between the laser diodes 3, 5 is beneficial. For this purpose, a common lower Bragg-reflector layer stack 6 is advantageous. As well, it is advantageous to arrange the laser diodes as close as possible to each other. Thus, according to a preferred embodiment and without restriction to the embodiment of FIGS. 2, 3, the lateral distance of the laser diodes from center to center is less than 500 micrometers. Preferably, the lateral dimension of the die is less than 300 micrometers and the lateral distance from center to center or between the optical axes of the laser diodes is less than 250 micrometers.

Figure 4:
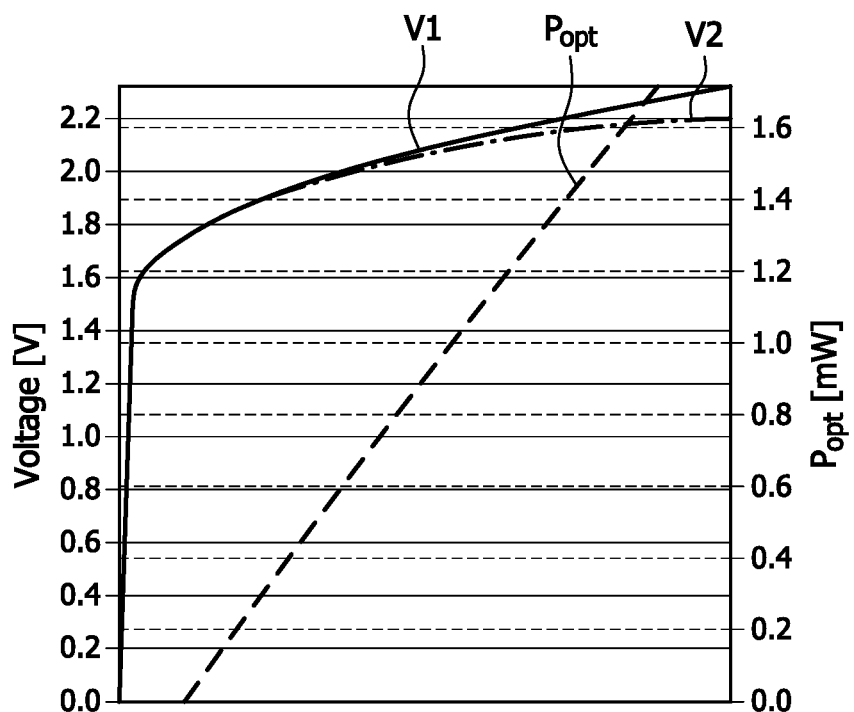
FIG. 4 shows measured characteristics of the VCSELs of an arrangement as schematically shown in FIGS. 2 and 3.

FIG. 4 shows a comparison of the measured voltage and output power characteristics of the laser diodes 3, 5 of an arrangement as schematically shown in FIGS. 2 and 3. The center to center distance of the mesas of the device is 200 micrometer. Curve V1 denotes the voltage characteristics of laser diode 3 and Curve V2 the voltage characteristics of laser diode 5 which is not lasing. The voltage drop across the lasing diode 3 increases faster with increasing laser current compared to non-lasing diode 5. The difference amounts to approximately 100 mV for a laser current of about I=3 mA in this example. Of course, the difference depends on the design of the laser diodes 3, 5, in particular on the nominal output power.

This difference in the laser voltage can be attributed entirely or at least substantially to the photon cooling effect. The increase of the voltage difference with the laser current is approximately linear as it corresponds to the laser output power $P_{opt}$ of laser diode 3 which is also approximately a linear function of the laser current.

As the voltage difference multiplied by the laser current gives the absolute value of the output power, the device according to the invention can be very advantageously also be used to determine the laser output power in absolute numbers. This is not straightforward to achieve for conventional laser diodes since, e.g., the measurement with a monitor diode is only indirectly and may even not be proportional to the emitted laser intensity. In contrast thereto, the determination of a voltage difference can be performed easily and in absolute numbers. To determine the output power in absolute numbers, the voltage difference may be determined together with the laser current. The product of the laser current with the voltage difference then directly yields the laser output power.

Thus, according to a refinement of the invention, the laser device comprises means for detecting the voltage difference between the first and second laser diode and means for determining or calculating the laser output power from the voltage difference.

Clearly, this refinement is not restricted to VCSELs as laser diodes or the specific arrangement as shown in FIGS. 2 and 3. For example, this refinement may also be applied to an arrangement of two edge emitting lasers on a common die. Generally, as the invention allows for a very simple determination of the laser output power, the invention may be employed as a light source for calibration purposes, e.g. to calibrate the laser output power of conventional laser diodes or other light sources.

Figure 5:
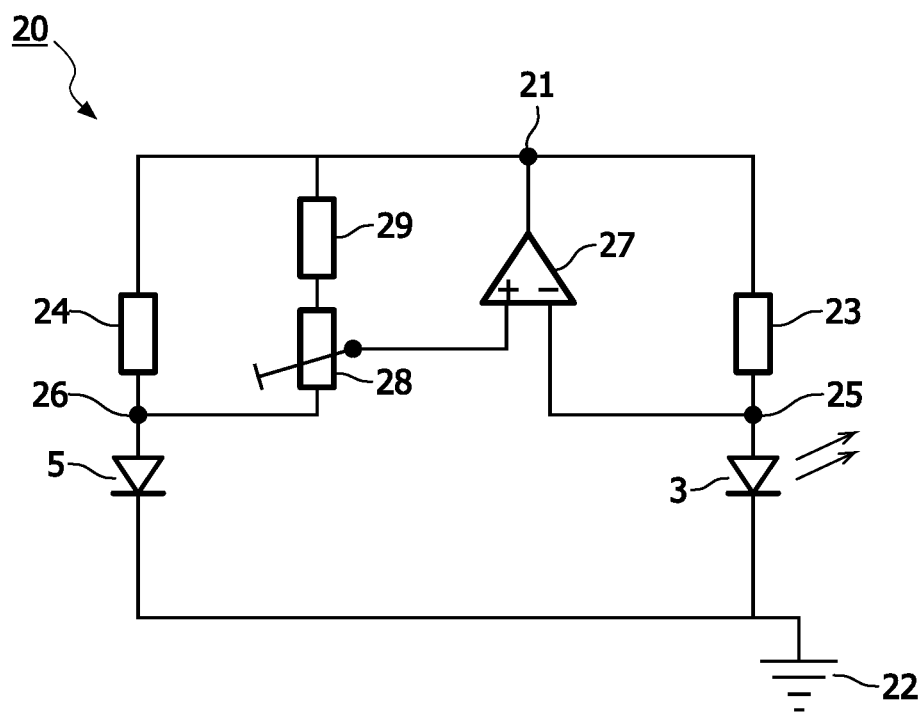
FIG. 5 shows an embodiment of a control circuitry for controlling and stabilizing the laser output power.

FIG. 5 shows a simple feedback loop control circuitry 20 which may be employed to control and stabilize the laser output power. The circuitry stabilizes the laser output power on the basis of the difference of the voltages across the first and said second laser diodes 3 and 5, respectively. More specifically, the feedback loop control circuitry 20 comprises a feedback loop with a differential amplifier, whereby voltage drops along two current paths are tapped and fed in, and wherein in each of the current paths one of the laser diodes is connected and whereby a voltage divider divides a predetermined and tunable ratio of the voltage drop along one of the current paths, and wherein the divided voltages are fed into the differential amplifier. In the example of FIG. 5, an operational amplifier 27 is used as the differential amplifier.

The power or operation voltage for the feedback loop control circuitry 20 is supplied between the output 21 of operational amplifier 27 and ground 22. The current through laser diodes 3, 5 flows through resistors 23 or 24, respectively, which are connected to the laser diodes 3, 5 in series.

The voltages for the feedback loop are tapped at tapping points 25, 26, located between resistor 23 and laser diode 3, and resistor 24 and non-lasing laser diode 5, respectively.

The voltages tapped from the tapping points 25, 26 are fed into a differential amplifier. In the embodiment shown in FIG. 5, an operational amplifier 27 is used for this purpose.

To provide for a tunable laser output power, a predetermined ratio is divided from the voltage tapped from the current path of laser diode 5 at point 26. For this purpose, the voltage fed into the operational amplifier is tapped from a potentiometer 28 connected in parallel to resistor 24. To allow for a precision trimming, the potentiometer 28 is connected in series with a further resistor 29.

The output 21 of the operational amplifier provides and controls the positive potential. By tuning the potentiometer, a specific difference of voltage drops across resistors 23, 24 is set. This voltage difference is fed as input into the operational amplifier, which compensates this difference and stabilizes this condition. In turn, the same voltage difference is established between tapping points 25 and 26 so that this voltage difference is also stabilized at the laser diodes 3, 5.

As the voltage difference between curves V1, V2 in FIG. 4 can be regarded as approximately linear, the circuitry as shown in FIG. 5 allows for a nearly linear tuning of the laser output power.

The embodiment of FIG. 5 may, e.g., be realized using the following components:

2 kO resistance for resistors 23 and 24,
100 kO resistance for resistor 29,
10 kO maximum resistance for potentiometer 28, and
an LM 324 module as operational amplifier 27.

Further, if using an arrangement as shown in FIGS. 2 and 3, the terminal contact 51 is connected to tapping point 26 and terminal contact 31 to tapping point 25. The common Cathode terminal contact 13 is connected to ground 22 of feedback loop control circuitry 20.

The circuitry shown in FIG. 5 is merely exemplary. Furthermore, the circuitry may comprise further components.

Using a feedback loop control circuitry 20 as shown similarly and simplified in FIG. 5 and a die as schematically shown in FIGS. 2 and 3, it has been verified that the laser output power, could be stabilized to about ±6% in a defined temperature range. In comparison, the laser output power of a conventional VCSEL drops by about 30% within this temperature range.

Although preferred embodiments of the present invention have been illustrated in the accompanying drawings and described in the foregoing description, it will be understood that the invention is not limited to the embodiments disclosed but is capable of numerous modifications without departing from the scope of the invention as set out in the following claims.

LIST OF REFERENCE SIGNS

1 Die
3 First laser diode
5 Second laser diode
6 Lower Bragg-reflector stack of laser diodes 3, 5
7 Upper Bragg-reflector stack of laser diodes 3, 5
9 Quantum well of laser diodes 3, 5
11 Current aperture of laser diodes 3, 5
12 Ring contact of laser diodes 3, 5
13 Common cathode terminal contact of laser diodes 3, 5
15 Surface etch on upper Bragg-reflector stack 7 of laser diode 5
20 Feedback loop control circuitry
21 Output 21 of operational amplifier 27
22 Ground
23, 24, 29 Resistors
25, 26 Tapping points
27 Operational amplifier
28 Potentiometer
31 Anode terminal contact of laser diode 3
51 Anode terminal contact of laser diode 5

The invention claimed is:

1. A laser device comprising:
a die;
a first laser diode on said die; and
a second laser diode on said die, said second laser diode being arranged laterally offset with respect to an optical axis of said first laser diode, each of said first and second laser diodes having at least one electrical connection terminal for applying a supply voltage, said first laser diode being capable of emitting laser light upon receiving a sufficient voltage when oriented at a given polarity with respect to the sufficient voltage, said second laser diode having a structure that avoids lasing if said sufficient voltage is received at said second laser diode when said second laser diode is oriented at said polarity with respect to the sufficient voltage.

2. The laser device as claimed in claim 1, further comprising control circuitry for stabilizing laser power of said first laser diode, said control circuitry using a voltage across said first laser diode laser as an input parameter.

3. The laser device according to claim 1, further comprising control circuitry connected to said first and said second laser diodes, said control circuitry stabilizing laser output power of said first laser diode on the basis of a difference between a voltage drop across said second laser diode and a voltage drop across said first laser diode.

4. The laser device according to claim 3, said control circuitry further comprising setting means for setting said output power by setting operating voltages of said first and second laser diodes.

5. The laser device according to claim 3, wherein said control circuitry comprises a feedback loop with a differential amplifier, whereby said voltage drops are along two current paths that are tapped and fed in, whereby in each of said current paths one of the laser diodes is connected and whereby a voltage divider divides a predetermined ratio of the voltage drop along one of said paths and the divided voltage is fed into said differential amplifier.

6. The laser device according to claim 1, wherein said first and said second laser diodes are vertical surface emitting laser diode mesa structures arranged laterally offset onto said die.

7. The laser device according to claim 6, wherein said first and second laser diodes share a common terminal on a backside of said die and have separated terminal contacts on a front side of the die.

8. The laser device according to claim 6, wherein said mesa structures share a common lower Bragg reflector stack.

9. The laser device according to claim 1, wherein said structure that avoids lasing reduces a resonator quality of said second laser diode.

10. The laser device according to claim 9, wherein said structure that avoids lasing acts by disturbing a phase front of light reflected back at a reflector element of said second laser diode.

11. The laser device according to claim 9, whereby said structure introduces a destructive interference at an interface of an upper Bragg reflector layer stack.

12. The laser device according to claim 1, wherein said first and said second laser diodes are vertical surface emitting laser diodes and wherein said structure that avoids lasing is a surface etch on top of said second laser diode.

13. The laser device according to claim 1, wherein said first and said second laser diodes are of equal design but differ in that the second laser diode includes said structure that avoids lasing.

14. The laser device according to claim 1, wherein a lateral distance between centers of said laser diodes is less than 500 micrometers.

15. The laser device according to claim 1, further comprising means for detecting a voltage difference between said first and second laser diodes and means for determining a laser output power of said first laser diode from said voltage difference.

16. A laser device comprising:
a die;
a first laser diode on said die;
a second laser diode on said die, said second laser diode being arranged laterally offset with respect to an optical axis of said first laser diode, each of said first and second laser diodes having at least one electrical connection terminal for applying a supply voltage, said first laser diode being capable of emitting laser light upon appliance of a sufficient voltage, said second laser diode having a structure that avoids lasing if said sufficient voltage is applied;
control circuitry connected to said first and sad second laser diodes, said control circuitry stabilizing laser output power of said first laser diode on the basis of a difference between a voltage drop across said second laser diode and a voltage drop across said first laser diode, wherein said control circuitry comprises a feedback loop with a differential amplifier, whereby said voltage drops are along two current paths that are tapped and fed in, whereby in each of said current paths one of the laser diodes is connected and whereby a voltage divider divides a predetermined ratio of the voltage drop along one of said paths and the divided voltage is fed into said differential amplifier.

17. A laser device comprising:
a die;
a first laser diode on said die; and
a second laser diode on said die, said second laser diode being arranged laterally offset with respect to a optical axis of said first laser diode, each of said first and second laser diodes having at least one electrical connection terminal for applying a supply voltage, said first laser diode being capable of emitting laser light upon appliance of a sufficient voltage, said second laser diode having a structure that avoids lasing if said sufficient voltage is applied, wherein said structure that avoids lasing acts by disturbing a phase front of light reflected back at a reflector element of said second laser diode.

18. A laser device comprising:
a die;
a first laser diode on said die; and
a second laser diode on said die, said second laser diode being arranged laterally offset with respect to an optical axis of said first laser diode, each of said first and second laser diodes having at least one electrical connection terminal for applying a supply voltage, said first laser diode being capable of emitting laser light upon appliance of a sufficient voltage, said second laser diode having a structure that avoids lasing if said sufficient voltage is applied, whereby said structure introduces a destructive interference at an interface of an upper Bragg reflector layer stack.

19. A laser device comprising:
a die;
a first laser diode on said die; and
a second laser diode on said die, said second laser diode being arranged laterally offset with respect to an optical axis of said first laser diode, each of said first and second laser diodes having at least one electrical connection terminal for applying a supply voltage, said first laser diode being capable of emitting laser light upon appliance of a sufficient voltage, said second laser diode having a structure that avoids lasing if said sufficient voltage is applied, wherein said structure that avoids lasing is a surface etch on too of said second laser diode.

* * * * *